(12) United States Patent  
Chakraborty et al.

(10) Patent No.: US 9,285,418 B2
(45) Date of Patent: Mar. 15, 2016

(54) METHOD AND APPARATUS FOR CHARACTERIZING THERMAL MARGINALITY IN AN INTEGRATED CIRCUIT

(71) Applicant: QUALCOMM Incorporated, San Diego, CA (US)

(72) Inventors: Tapan J Chakraborty, San Diego, CA (US); Rajamani Sethuram, San Diego, CA (US); Ratibor Radojcic, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 281 days.

(21) Appl. No.: 13/793,880

(22) Filed: Mar. 11, 2013

(65) Prior Publication Data

US 2013/0285687 A1 Oct. 31, 2013

Related U.S. Application Data

(60) Provisional application No. 61/640,383, filed on Apr. 30, 2012, provisional application No. 61/756,916, filed on Jan. 25, 2013.

(51) Int. Cl.
*G01R 31/26* (2014.01)
*H01L 21/66* (2006.01)
*G01R 31/28* (2006.01)

(52) U.S. Cl.
CPC ........ *G01R 31/2874* (2013.01); *G01R 31/2856* (2013.01); *G01R 31/2875* (2013.01)

(58) Field of Classification Search
CPC ........... G01R 31/2601; G01R 31/2607; H01L 2924/00; H01L 2924/0002; H01L 2224/73265

USPC ............ 324/750.06, 762.02, 762.03, 757.04, 324/719, 750.03, 762.01

See application file for complete search history.

(56) References Cited

U.S. PATENT DOCUMENTS

| | | | |
|---|---|---|---|
| 6,879,172 B1 | 4/2005 | Eppes et al. | |
| 7,564,256 B2 | 7/2009 | Gattiker et al. | |
| 7,590,509 B2 | 9/2009 | Riedlinger et al. | |
| 7,714,599 B2 | 5/2010 | Maggi et al. | |
| 2005/0054125 A1 | 3/2005 | Ku | |
| 2005/0229056 A1* | 10/2005 | Rohrbaugh | G01R 31/318566 714/726 |
| 2007/0269911 A1* | 11/2007 | Co | G01R 31/3016 438/17 |
| 2008/0211531 A1* | 9/2008 | Gattiker | G01R 31/31858 324/762.02 |
| 2008/0307260 A1* | 12/2008 | Kang | G06F 11/2236 714/27 |
| 2010/0045326 A1 | 2/2010 | Archer, III et al. | |
| 2010/0332177 A1* | 12/2010 | Wu | G01R 31/318558 702/117 |

(Continued)

OTHER PUBLICATIONS

International Search Report and Written Opinion—PCT/US2013/038930—ISA/EPO—Jul. 19, 2013.

(Continued)

*Primary Examiner* — Patrick Assouad
*Assistant Examiner* — Taqi Nasir
(74) *Attorney, Agent, or Firm* — Chui-kiu Teresa Wong; Paul Holdaway

(57) ABSTRACT

Apparatus and methods are described herein for emulating the hot spot distribution of a functional test by applying vectors for structural test to an integrated circuit (IC). The affects of the hot spots can then be tested and characterized. The vectors may be generated on the IC, or may be fed to the IC via an external source.

47 Claims, 6 Drawing Sheets

(56) References Cited

U.S. PATENT DOCUMENTS

2011/0006794 A1     1/2011    Sellathamby et al.
2012/0049874 A1*   3/2012    LaCroix ............ G01R 31/2875
                                                       324/750.03

OTHER PUBLICATIONS

Puttaswamy K., et al., "Thermal Herding: Microarchitecture Techniques for Controlling Hotspots in High-Performance 3D-Integrated Processors," 2007 IEEE 13th International Symposium on High Performance Computer Architecture, 2007, pp. 193-204.

Sanyal A., et al., "A Built-in Test and Characterization Method for Circuit Marginality Related Failures", Quality Electronic Design, 2008. ISQED 2008, 9th International Symposium on, IEEE, Piscataway, NJ, USA, Mar. 17, 2008, pp. 838-843, XP031239639, ISBN: 978-0-7695-3117-5.

* cited by examiner

METHOD AND APPARATUS FOR CHARACTERIZING THERMAL MARGINALITY IN AN INTEGRATED CIRCUIT

CLAIM OF PRIORITY UNDER 35 U.S.C. §119

The present Application for Patent claims priority to Provisional Application No. 61/640,383 entitled "CHARACTERIZATING THERMAL MARGINALITY FOR 2D/3D ICS" filed Apr. 30, 2012, and Provisional Application No. 61/756,916 entitled "METHOD AND APPARATUS FOR CHARACTERIZING THERMAL MARGINALITY IN AN INTEGRATED CIRCUIT" filed Jan. 25, 2013, and assigned to the assignee hereof and hereby expressly incorporated by reference herein.

BACKGROUND

1. Field

This application relates generally to integrated circuits, and more particularly to testing the affects of thermal hot spots on an integrated circuit.

2. Background

When operating an integrated circuit (IC), thermal hot spots occur at different regions of the IC. Increases in temperature impact the available design margin. The affects of temperature on an IC applies to both two-dimensional and three-dimensional devices. For three-dimensional devices, thermal hot spots may also affect the 3D interconnect through-silicon vias (TSVs). For example, difference in the thermal coefficient of TSV material and the silicon on the chip may cause mechanical stress around the TSV region, and may impact the electrical performance of the TSV interconnect.

Current tools cannot model or simulate the thermal gradient of an IC to help designers to design for thermal marginality. For example, existing electronic design automation (EDA) tools cannot model the thermal gradient phenomenon.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In accordance with some aspects, a method for testing integrated circuit performance comprises generating, via a design-for-test structure on the IC, one or more thermal hot spots in one or more core blocks of the IC, and initiating one or more tests on the one or more components of the IC over a range of voltage and frequency values when at least one of the one or more thermal hot spots is present.

Other aspects include one or more of an apparatus including one or more means for performing the above-described methods and an apparatus having a memory in communication with a processor that is configured to perform the above-described methods.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

Various aspects are now described with reference to the drawings. In the following description, for purposes of explanation, numerous specific details are set forth in order to provide a thorough understanding of one or more aspects. It may be evident, however, that such aspect(s) may be practiced without these specific details.

When running functional vectors on an integrated circuit, different paths through the circuit are excited, creating various hot spots. The apparatus and methods described herein are configured to emulate the hot spot distribution of a functional test by applying vectors for structural test to the circuit. The affects of the hot spots can then be tested and characterized.

Figure 1:
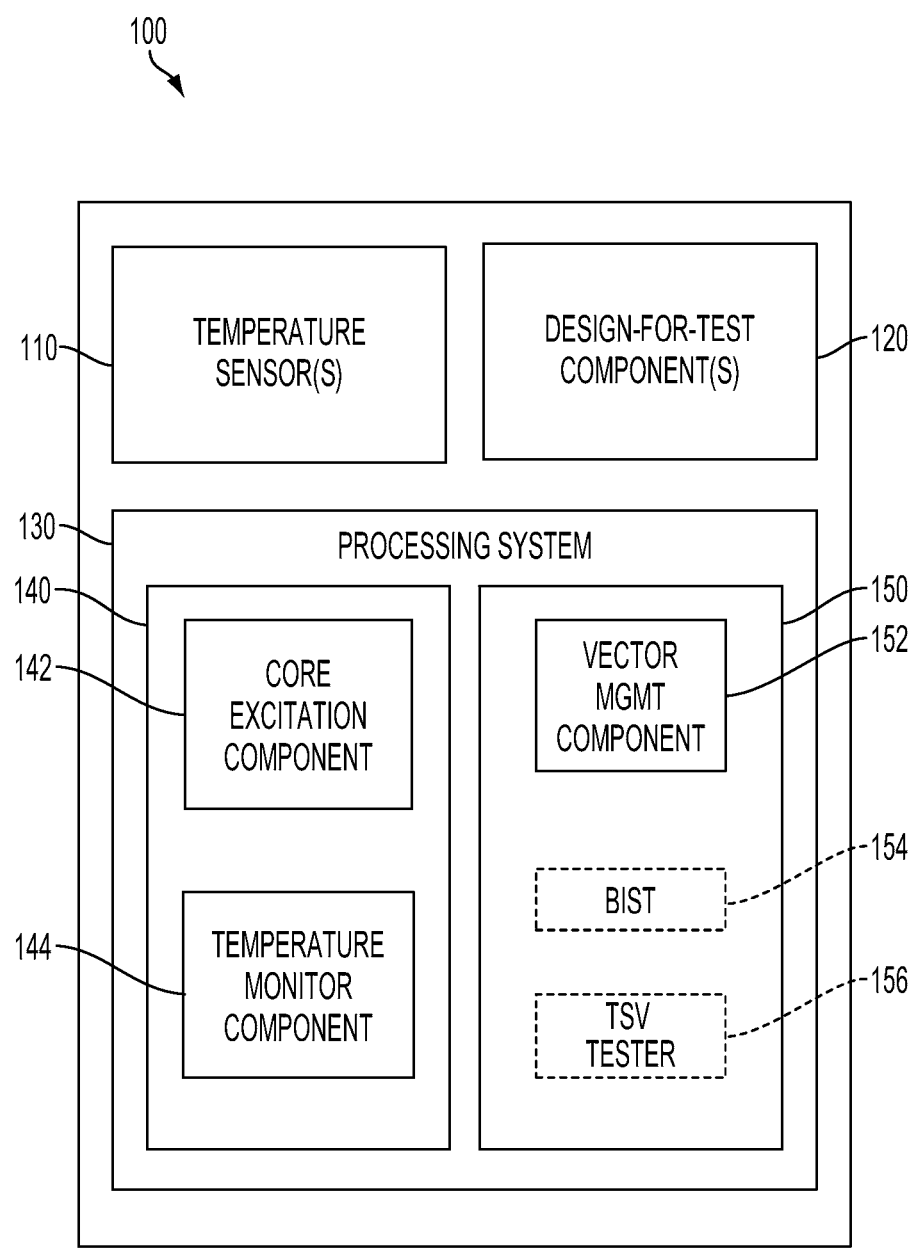
FIG. 1 is a functional block diagram of an example of an integrated circuit (IC)

FIG. 1 is a functional block diagram of an example of an integrated circuit (IC) 100, which may implement various disclosed aspects. IC 100 may be, for example, a two-dimensional IC or a three-dimensional IC. IC 100 may include one or more temperature sensors 110, one or more design-for-test (DFT) components 120, and a processing system 130. Processing system 130 may include a thermal hot spot generating component 140 and a structural test management component 150.

In some aspects, each of the one or more temperature sensors 110 may be associated with an operating section or core block of IC 100, and may be configured to measure the temperature of the associated section. The one or more DFT components 120 may be configured to collect the temperature measurements performed by temperature sensors 110. The one or more DFT components 120 may also be configured test the core blocks of the IC.

Hot spot generating component 140 may be configured to generate thermal hot spots in one or more core blocks of IC 100 based on a thermal profile. The thermal profile may reflect the hot spots generated during normal operation of the IC. Hot spot generating component 140 may include a core excitation component 142 and a temperature monitoring component 144. Core excitation component 142 may be configured to cause one or more core blocks of the IC to become active at designated times. Core excitation component 142 may be controlled by a DFT component 120. Temperature monitoring component 144 may be configured to periodically collect temperature readings from the one or more temperature sensors to determine when a desired temperature, according to the thermal profile, has been reached.

Structural test management component 150 may be configured to manage the testing of IC 100 in order to detect the affects of heat on the IC. Structural test management component 150 may include a vector management component 152, a built-in self test component 154, and a TSV testing component 156. Vector management component 152 may be configured to apply structural vectors to the IC that mimic the normal functional operation of the IC. In some aspects, the structural vectors may be generated on chip, while in other aspects, the structural vectors may be input from an external source. TSV testing component 156 may be configured to perform at-speed TSV interconnect testing, via a DFT 120, when a thermal hot spot is present. In some aspects, if the TSV test is successful, the built-in-self-test (BIST) component 154 may then start a built-in-self-test over a range of voltages and frequencies to fully characterize the chip design. The BIST may be a memory BIST or a logic BIST.

Figure 2:
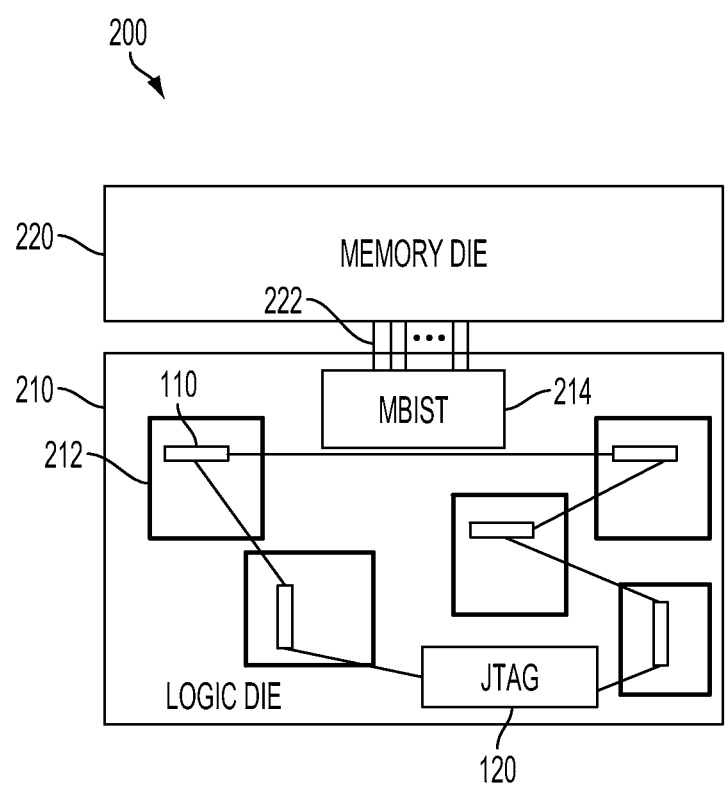
FIG. 2 is an example of a 3D IC.

FIG. 2 depicts an example of a three-dimensional IC 200. IC 200 may include a memory die 220 connected via on or more TSVs 222, to a logic device 210. Logic device 210 may comprise one or more core blocks 212, each including one or more temperature sensors 110. Logic die 210 may also include a DFT structure 120 for accessing the temperature sensors 110, and a MBIST 214 for executing a built-in-self-test of the memory die when a hot spot is present.

Figure 3:
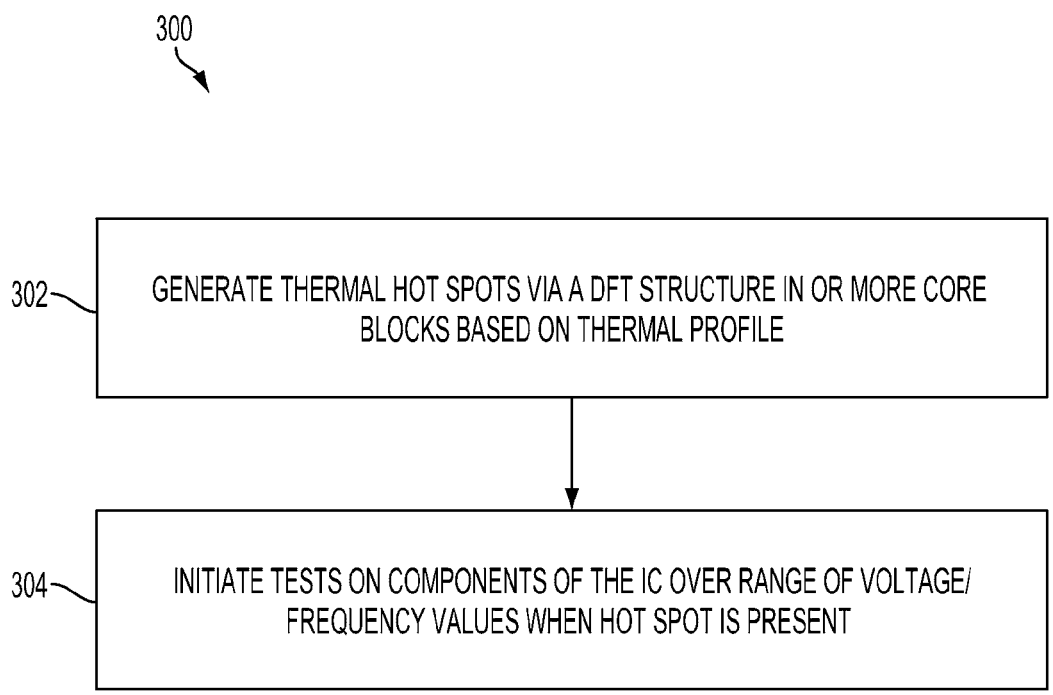
FIG. 3 is a flowchart illustrating an example of a method for testing performance of an IC.

FIG. 3 depicts a method 300 for testing the performance of an IC, such as IC 100 (FIG. 1) or IC 200 (FIG. 2). As shown at 302, a thermal hot spot may be generated in one or more sections of an IC based on a received thermal profile. Prior to initiating a test, a thermal profile of the IC may be created, indicating the desired temperature distribution across the different temperature sensors on the IC. The thermal hot spots may be generated using one on more DFT components, such as DFT components 120. To generate a thermal hotspot, one or more core blocks of the IC may be excited, using internally or externally generated structural test vectors. The structural test vectors are designed to mimic the functional operation of the core blocks of the IC. When the structural vectors are applied to a core block, the temperature sensors are monitored until the temperature reaches the desired temperature indicated in the thermal profile.

As shown at 304, one or more tests on one or more components of the IC may be initiated when a temperature sensor reaches the desired temperature. The test may be performed over a range of voltage and frequency values to determine the effects of voltage/frequency changes on the chip. For example, the tests may be used to determine whether changes in voltage/frequency affect the temperature of one or more core blocks. In some aspects, a logic or memory built-in-self-test operation may be performed to test logic or memory blocks of the IC. In other aspects, through-silicon-via (TSV) test may be performed to test the TSV performance at the desired temperature.

In accordance with some aspects, hotspots may be generated sequentially and/or concurrently at different portions of the IC, generating "walking" hot spots. The one or more tests may be performed upon generation of each hot spot.

Figure 4:
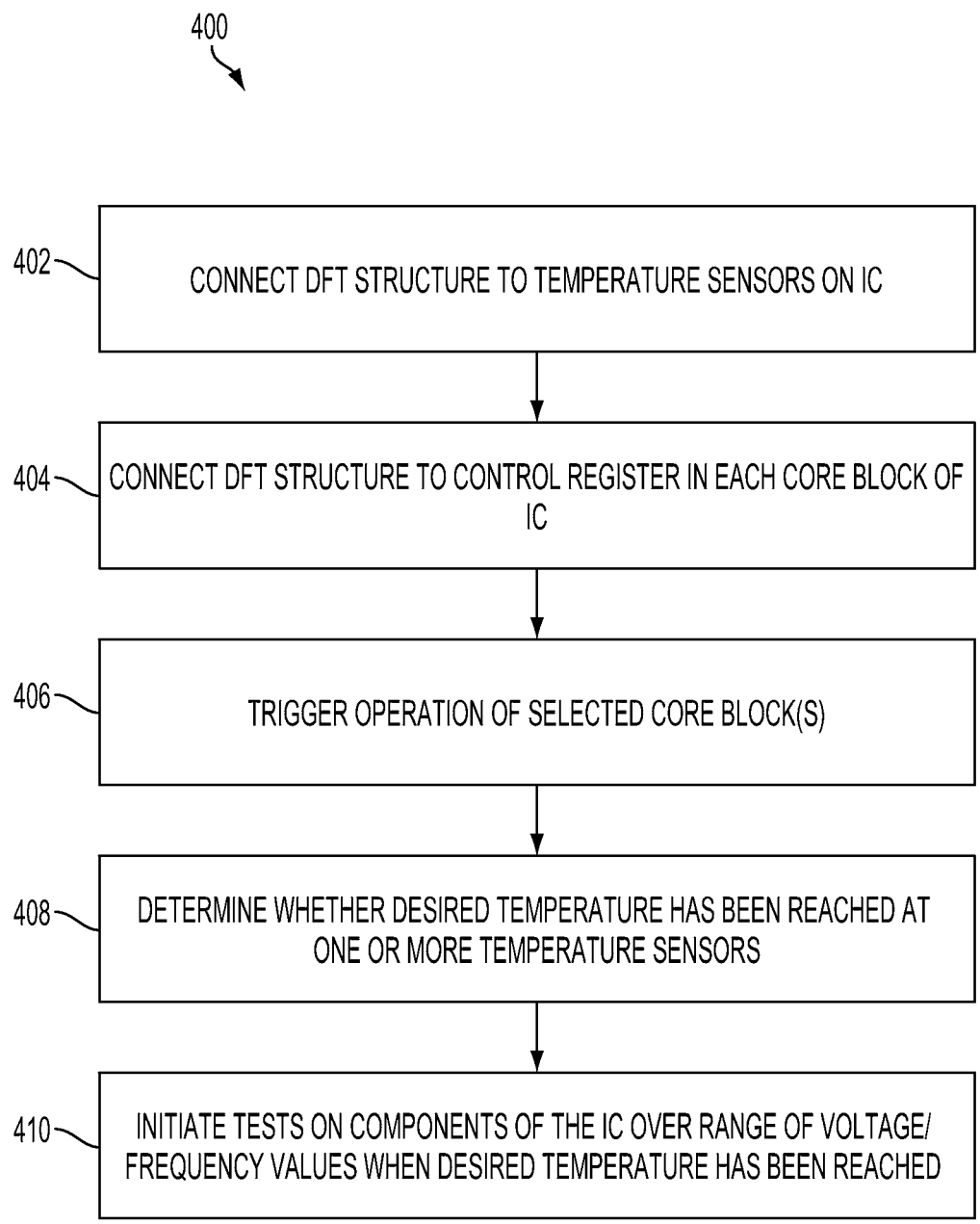
FIG. 4 is another flowchart illustrating an example of a method for testing performance of an IC.

FIG. 4 depicts a more detailed example of a process 400 for testing an IC. As shown at 402, a DFT component may be connected, via a first connection chain to a plurality of temperature sensors on the IC. This DFT component may be configured to selectively obtain the measurements taken at each temperature sensor. As shown at 404, the DFT component may be connected, via a second connection chain, to a control register within each core block of the IC. The control register may be configured to receive commands, via the DFT component, to turn on or turn off activity within the associated core block.

As shown at 406, a first instruction may be transmitted, via the DFT component to at least one core block of the IC to trigger operation of the core block. Triggering operation of the core block may include feeding one or more structural vectors into the core block to trigger its operation. The structural vectors may be generated internally or externally to the IC. As shown at 408, a second instruction is periodically transmitted, via the DFT component to collect the measurements taken at each temperature sensor to determine whether the IC has reached a desired operating temperature. As shown at 408, one or more tests on the IC may be performed over a range of voltage/frequency values when the desired operating temperature has been reached.

Figure 5:
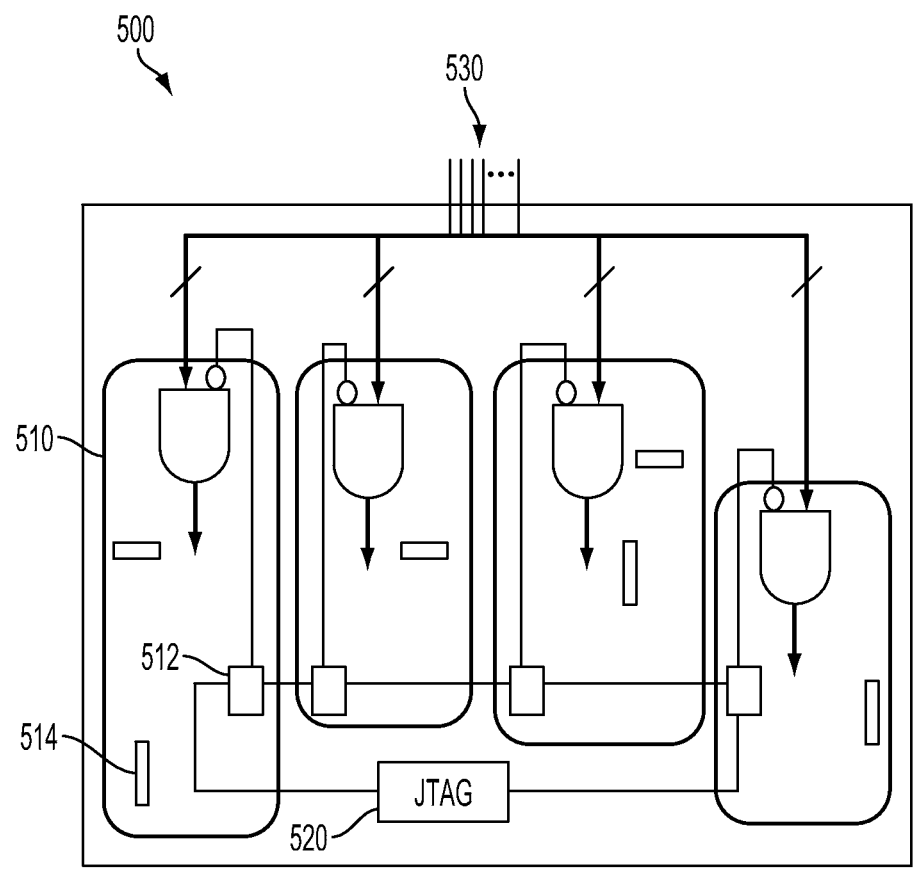
FIG. 5 is an example of an IC.

FIG. 5 depicts one example of an IC 500 configured to receive external structural test vectors. IC 500 may include a plurality of core blocks 510. Each core block may include a control register 512 and one or more temperature sensors 514, in addition to the other operating components of the core block. The control register in each core block 510 is connected to a DFT component 520. Externally generated structural vectors may be scanned into the core blocks 510, as shown at 530. In some aspects, all core blocks 510 may be initially enabled, and the structural vectors may be shifted into each of the core blocks, as shown at 530. Each control register 512, which may be programmed by DFT component 520, may receive instructions via the DFT component to activate the respective core block. In accordance with some aspect, automated test equipment (ATE) may be used to shift deterministic patterns sequentially into different regions of the design to create a walking thermal hot spot.

Figure 6:
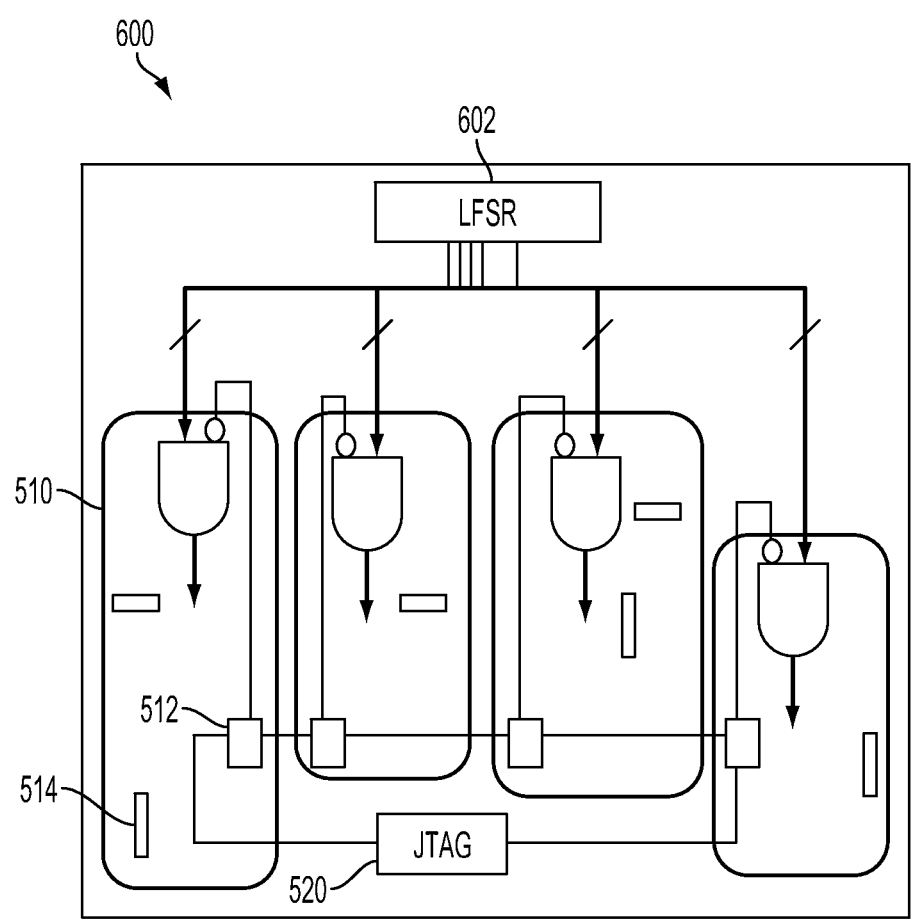
FIG. 6 is another example of an IC.

FIG. 6 depicts an example of an IC 600 to generate structural vectors on the chip. IC 600 is similar to IC 500. In addition to those components described above with respect to FIG. 5, FIG. 6 may also include a structural vector generating component 602. In some aspect, the structural vector generating component may be a linear feedback shift register (LFSR) configured to generate pseudo-random patterns. The LFSR may act as an on-chip pattern generator that can be executed sequentially, and programmed via the DFT component 520, to create a walking thermal hot spot.

When using either externally supplied structural vectors, as shown in FIG. 5, or internally generated structural vectors, as shown in FIG. 6, vector application temperature readings are monitored at regular intervals. DFT component 520 may be programmed to issues instructions to perform temperature readings. When the desired temperature is achieved, the DFT component 520 may be reprogrammed to excite different core blocks of the IC to create a walking hot spot.

As used in this application, the terms "component," "module," "system" and the like are intended to include a computer-related entity, such as but not limited to hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Various aspects or features are presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches may also be used.

The various illustrative logics, logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Additionally, at least one processor may comprise one or more modules operable to perform one or more of the steps and/or actions described above.

Further, the steps and/or actions of a method or algorithm described in connection with the aspects disclosed herein may be embodied directly in hardware, in a software module executed by a processor, or in a combination of the two. A software module may reside in RAM memory, flash memory, ROM memory, EPROM memory, EEPROM memory, registers, a hard disk, a removable disk, a CD-ROM, or any other form of storage medium known in the art. An exemplary storage medium may be coupled to the processor, such that the processor can read information from, and write information to, the storage medium. In the alternative, the storage medium may be integral to the processor. Further, in some aspects, the processor and the storage medium may reside in an ASIC. Additionally, the ASIC may reside in a user terminal. In the alternative, the processor and the storage medium may reside as discrete components in a user terminal Additionally, in some aspects, the steps and/or actions of a method or algorithm may reside as one or any combination or set of codes and/or instructions on a machine readable medium and/or computer readable medium, which may be incorporated into a computer program product.

In one or more aspects, the functions described may be implemented in hardware, software, firmware, or any combination thereof. If implemented in software, the functions may be stored or transmitted as one or more instructions or code on a computer-readable medium. Computer-readable media includes both computer storage media and communication media including any medium that facilitates transfer of a computer program from one place to another. A storage medium may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection may be termed a computer-readable medium. For example, if software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs usually reproduce data optically with lasers. Combinations of the above should also be included within the scope of computer-readable media.

While the foregoing disclosure discusses illustrative aspects and/or embodiments, it should be noted that various changes and modifications could be made herein without departing from the scope of the described aspects and/or embodiments as defined by the appended claims. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

What is claimed is:

1. A method for testing integrated circuit (IC) performance, comprising:
   generating, via a design-for-test structure on the IC, one or more thermal hot spots in one or more core blocks of the IC based on a received thermal profile, wherein the generating the one or more thermal hot spots in one or more core blocks comprises exciting at least one core block of the IC by using test vectors that mimic a functional operation of the at least one core block; and
   initiating one or more through-silicon-via (TSV) tests on one or more components of the IC over a range of voltage and frequency values when at least one of the one or more thermal hot spots is present.

2. The method of claim 1, wherein generating the one or more thermal hot spots comprises:
   determining when the at least one core block reaches a specified temperature based on the thermal profile.

3. The method of claim 1, further comprising:
   upon completing a test of one or more components of the IC when a first thermal hot spot is present, performing another test of the one or more components of the IC when a second thermal hot spot is present in a location different from or in addition to a location of the first thermal hotspot.

4. The method of claim 2, wherein exciting the at least one core block of the IC comprises turning on at least one circuit in the core block via a design for test structure on the IC.

5. The method of claim 1, wherein the one or more hot spots mimic a temperature condition present during a functional test of the IC.

6. The method of claim 2, wherein determining when the at least one core block reaches a specified temperature comprises:
periodically reading one or more registers associated with one or more temperature sensors on the IC, wherein the registers are read via a design for test structure on the IC.

7. The method of claim 1, wherein the IC is a two-dimensional or a three-dimensional IC.

8. The method of claim 1, wherein the one more tests further comprise one or more of a memory built-in self-test or a logic built-in self-test, or an at speed through-silicon-via (TSV) test.

9. The method of claim 1, wherein generating the one or more thermal hot spots further comprises:
connecting the design-for-test structure, via a first connection chain, to a plurality of temperature sensors on the IC;
connecting the design-for-test structure, via a second connection chain, to a control register in each of the plurality of core blocks on the IC;
transmitting a first instruction, via the design-for-test structure, to at least one core block on the IC to trigger operation of the core block; and
transmitting a second instruction, via the design-for-test structure, to periodically check the temperature of one or more of the plurality of temperature sensors until a desired temperature is reached.

10. The method of claim 9, wherein triggering operation of the core block comprises feeding one or more structural vectors into the core block to trigger its operation.

11. The method of claim 10, wherein the structural vectors are fed into the core block via external automated test equipment.

12. The method of claim 11, wherein the structural vectors are generated on the IC.

13. An apparatus for testing integrated circuit (IC) performance, comprising:
means for generating, via a design-for-test structure on the IC, one or more thermal hot spots in one or more core blocks of the IC based on a received thermal profile, wherein the means for generating the one or more thermal hot spots in one or more core blocks is configured to excite at least one core block of the IC by using test vectors that mimic a functional operation of the at least one core block; and
means for initiating one or more through-silicon-via (TSV) tests on one or more components of the IC over a range of voltage and frequency values when at least one of the one or more thermal hot spots is present.

14. The apparatus of claim 13, wherein the means for wherein generating the one or more thermal hot spots comprises:
means for determining when the at least one core block reaches a specified temperature based on the thermal profile.

15. The apparatus of claim 13, further comprising:
upon completing a test of one or more components of the IC when a first thermal hot spot is present, means for performing another test of the one or more components of the IC when a second thermal hot spot is present in a location different from or in addition to a location of the first thermal hotspot.

16. The apparatus of claim 14, wherein the means for exciting the at least one core block of the IC comprises means for turning on at least one circuit in the core block via a design for test structure on the IC.

17. The apparatus of claim 13, wherein the one or more hot spots mimic a temperature condition present during a functional test of the IC.

18. The apparatus of claim 14, wherein the means for determining when the at least one core block reaches a specified temperature comprises:
means for periodically reading one or more registers associated with one or more temperature sensors on the IC, wherein the registers are read via a design for test structure on the IC.

19. The apparatus of claim 13, wherein the IC is a two-dimensional or a three-dimensional IC.

20. The apparatus of claim 13, wherein the one more tests further comprise one or more of a memory built-in self-test or a logic built-in self-test, or an at speed through-silicon-via (TSV) test.

21. The apparatus of claim 13, wherein the means for generating the one or more thermal hot spots further comprises:
means for connecting the design-for-test structure, via a first connection chain, to a plurality of temperature sensors on the IC;
means for connecting the design-for-test structure, via a second chain, to a control register in each of the plurality of core blocks on the IC;
means for transmitting a first instruction, via the design-for-test structure, to at least one core block on the IC to trigger operation of the core block; and
means for transmitting a second instruction, via the design-for-test structure, to periodically check the temperature of one or more of the plurality of temperature sensors until a desired temperature is reached.

22. The apparatus of claim 21, wherein the means for triggering operation of the core block comprises means for feeding one or more structural vectors into the core block to trigger its operation.

23. The apparatus of claim 22, wherein the structural vectors are fed into the core block via external automated test equipment.

24. The apparatus of claim 22, wherein the structural vectors are generated on the IC.

25. An apparatus for testing integrated circuit (IC) performance, comprising:
at least one processor configured to:
generate, via a design-for-test structure on the IC, one or more thermal hot spots in one or more core blocks of the IC based on a received thermal profile, wherein the at least one processor is configured to generate the one or more thermal hot spots in one or more core blocks by exciting at least one core block of the IC by using test vectors that mimic a functional operation of the at least one core block; and
initiate one or more through-silicon-via (TSV) tests on one or more components of the IC over a range of voltage and frequency values when at least one of the one or more thermal hot spots is present; and
a memory coupled to the at least one processor.

26. The apparatus of claim 25, wherein in generating the one or more thermal hot spots, the at least one processor is further configured to:
determine when the at least one core block reaches a specified temperature based on the thermal profile.

27. The apparatus of claim 25, wherein the at least one processor is further configured to:
   upon completing a test of one or more components of the IC when a first thermal hot spot is present, perform another test of the one or more components of the IC when a second thermal hot spot is present in a location different from or in addition to a location of the first thermal hotspot.

28. The apparatus of claim 26, wherein in exciting the at least one core block of the IC, the at least one processor is further configured to turn on at least one circuit in the core block via a design for test structure on the IC.

29. The apparatus of claim 25, wherein the one or more hot spots mimic a temperature condition present during a functional test of the IC.

30. The apparatus of claim 26, wherein in determining when the at least one core block reaches a specified temperature, the at least one processor is further configured to:
   periodically read one or more registers associated with one or more temperature sensors on the IC, wherein the registers are read via a design for test structure on the IC.

31. The apparatus of claim 25, wherein the IC is a two-dimensional or a three-dimensional IC.

32. The apparatus of claim 25, wherein the one more tests comprise one or more of a memory built-in self-test or a logic built-in self-test, or an at speed through-silicon-via (TSV) test.

33. The apparatus of claim 25, wherein in generating the one or more thermal hot spots, the at least one processor is further configured to:
   connect the design-for-test structure, via a first connection chain, to a plurality of temperature sensors on the IC;
   connect the design-for-test structure, via a second chain, to a control register in each of the plurality of core blocks on the IC;
   transmit a first instruction, via the design-for-test structure, to at least one core block on the IC to trigger operation of the core block; and
   transmit a second instruction, via the design-for-test structure, to periodically check the temperature of one or more of the plurality of temperature sensors until a desired temperature is reached.

34. The apparatus of claim 33, wherein in triggering operation of the core block, the at least one processor is further configured to feed one or more structural vectors into the core block to trigger its operation.

35. The apparatus of claim 34, wherein the structural vectors are fed into the core block via external automated test equipment.

36. The apparatus of claim 34, wherein the structural vectors are generated on the IC.

37. A non-transitory computer-readable medium containing instructions comprising:
   code for generating, via a design-for-test structure on the IC, one or more thermal hot spots in one or more core blocks of the IC based on a received thermal profile, wherein the code generating the one or more thermal hot spots in one or more core blocks comprises code for exciting at least one core block of the IC by using test vectors that mimic a functional operation of the at least one core block; and
   code for initiating one or more through-silicon-via (TSV) tests on one or more components of the IC over a range of voltage and frequency values when at least one or the one or more thermal hot spots is present.

38. The non-transitory computer-readable medium of claim 37, wherein the code for generating the one or more thermal hot spots further comprises:
   code for determining when the at least one core block reaches a specified temperature based on the thermal profile.

39. The non-transitory computer-readable medium of claim 37, further comprising code for acting upon completion of a test of one or more components of the IC when a first thermal hot spot is present, the code performs another test of the one or more components of the IC when a second thermal hot spot is present in a location different from or in addition to a location of the first thermal hot spot.

40. The non-transitory computer-readable medium of claim 38, wherein the code for exciting the at least one core block of the IC further comprises code for turning on at least one circuit in the core block via a design for test structure on the IC.

41. The non-transitory computer-readable medium of claim 37, wherein the code for generating the one or more thermal hot spots causes the one or more hot spots to mimic a temperature condition present during a functional test of the IC.

42. The non-transitory computer-readable medium of claim 38 wherein the code for determining when the at least one core block reaches a specified temperature further comprises:
   code for periodically reading one or more registers associated with one or more temperature sensors on the IC, wherein the registers are read via a design-for-test structure on the IC.

43. The non-transitory computer-readable medium of claim 37, wherein the code further directs the execution of one or more of the following tests: a memory built-in self-test or a logic built-in test, and an at speed through-silicon-via (TSV) test.

44. The non-transitory computer-readable medium of claim 37, wherein the code for generating the one or more thermal hot spots further comprises:
   code for connecting the design-for-test structure, via a first connection chain, to a plurality of temperature sensors on the IC;
   code for connecting the design-for-test structure, via a second connection chain, to a control register in each of the plurality of core blocks on the IC;
   code for transmitting a first instruction, via the design-for-test structure, to at least one core block on the IC to trigger operation of the core block; and
   code for transmitting a second instruction, via the design-for-test structure, to periodically check the temperature of one or more of the plurality of temperature sensors until a desired temperature is reached.

45. The non-transitory computer-readable medium of claim 44, wherein the code for triggering operation of the core block comprises code for feeding one or more structural vectors into the core block to trigger operation of the core block.

46. The non-transitory computer-readable medium of claim 45, wherein the code for feeding one or more structural vectors into the core block feeds the structural vectors into the core block directs external automated test equipment to feed the structural vectors into the core block.

47. The non-transitory computer-readable medium of claim 46, wherein the code for generating the structural vectors generates the structural vectors on the IC.

* * * * *